(12) United States Patent
Hon et al.

(10) Patent No.: US 7,652,297 B2
(45) Date of Patent: Jan. 26, 2010

(54) LIGHT EMITTING DEVICE

(75) Inventors: Lee Kee Hon, Penang (MY); Tan Kheng Leng, Fort Collins, CO (US); Lee Chiau Jin, Fort Collins, CO (US); Ng Keat Chuan, Fort Collins, CO (US); Oon Slang Ling, Fort Collins, CO (US); Ong Klam Soon, Fort Collins, CO (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 103 days.

(21) Appl. No.: 11/853,179

(22) Filed: Sep. 11, 2007

(65) Prior Publication Data

US 2009/0065793 A1 Mar. 12, 2009

(51) Int. Cl.
*H01L 27/15* (2006.01)

(52) U.S. Cl. .................... 257/81; 257/99; 257/100; 257/E33.056; 257/E25.032; 257/98

(58) Field of Classification Search .................. 257/98, 257/82, 91, 99, 100, 116, 117, 432–437, 257/749, E33.056–E33.059, E25.032
See application file for complete search history.

(56) References Cited

U.S. PATENT DOCUMENTS

| | | | |
|---|---|---|---|
| 2003/0020077 A1* | 1/2003 | Horiuchi et al. | 257/81 |
| 2006/0278882 A1* | 12/2006 | Leung et al. | 257/98 |
| 2008/0035948 A1* | 2/2008 | Shin et al. | 257/99 |

* cited by examiner

*Primary Examiner*—Fernando L Toledo
*Assistant Examiner*—Mamadou Diallo

(57) ABSTRACT

A light emitting device is disclosed herein. An embodiment of the light emitting device comprises a substrate and a reflector extending from the substrate. The reflector forms a cavity in conjunction with the substrate. A light emitter is located in the cavity. At least one first recessed portion is located in the reflector, the at least one first recessed portion extends substantially axially around the reflector.

17 Claims, 2 Drawing Sheets

LIGHT EMITTING DEVICE

BACKGROUND

Light emitting devices typically include a light emitting diode (LED) located in a cavity. The walls of the cavity may be reflective in order to increase the efficiency of the light-emitting device. The cavity is filled with an encapsulate, such as silicone, in order to protect the LED and the reflector.

Encapsulants tend to delaminate or pull away from the reflector walls. Once the delamination has started on a small section of the wall, the delamination typically continues rapidly. The delaminated areas may enable contaminants to enter the light-emitting device and either cause failure or a reduction in the efficiency of the light-emitting device. The delamination may also adversely affect the light pattern proximate the delaminated wall, which may reduce or diffract the emitted light. Eventually, the delamination may spread to the LED, which may cause damage to the LED and failure of the light-emitting device.

DETAILED DESCRIPTION

Figure 1:
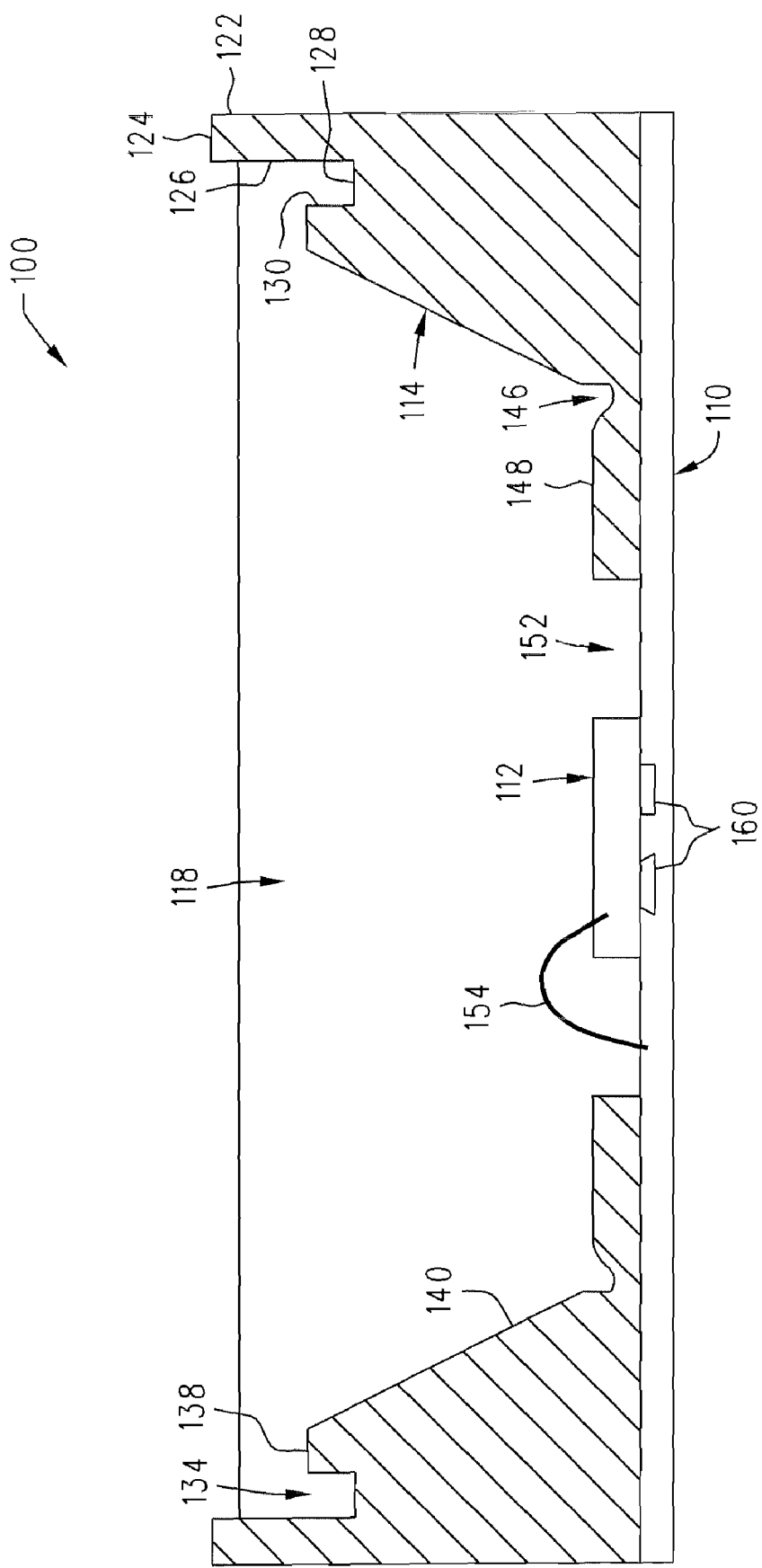
FIG. 1 is a side cut away view of an embodiment of a light-emitting device.

A side cut away view of an embodiment of a light-emitting device 100 is shown in FIG. 1. As described in greater detail below, the light-emitting device 100 described herein uses devices and methods to reduce the probability that an encapsulant used in the light-emitting device 100 will delaminate or peel from components within the light-emitting device 100. In addition, devices and methods are described herein to reduce the probability that components within the light-emitting device 100 become dislodged.

The light-emitting device 100 includes a substrate 110 on which a Light Emitting Diode (LED) 112 and a reflector 114 are mounted. The LED 112 may be electrically connected to the substrate 110. The portion of the reflector 114 located proximate the substrate 110 is sometimes referred to as the lower portion. It is noted that the LED 112 is used for illustration and that light emitters other than LEDs may be used in conjunction with the light emitting device 100 described herein. The combination of the substrate 110 and the reflector 114 forms a cavity 118 in which the LED 112 is located. An encapsulant, such as silicone, is located in and fills or substantially fills the cavity 118. As described in greater detail below, the encapsulant adheres to the reflector 114, the substrate 110, and the LED 112. The encapsulant serves to keep contaminants out of the cavity 118.

Figure 2:
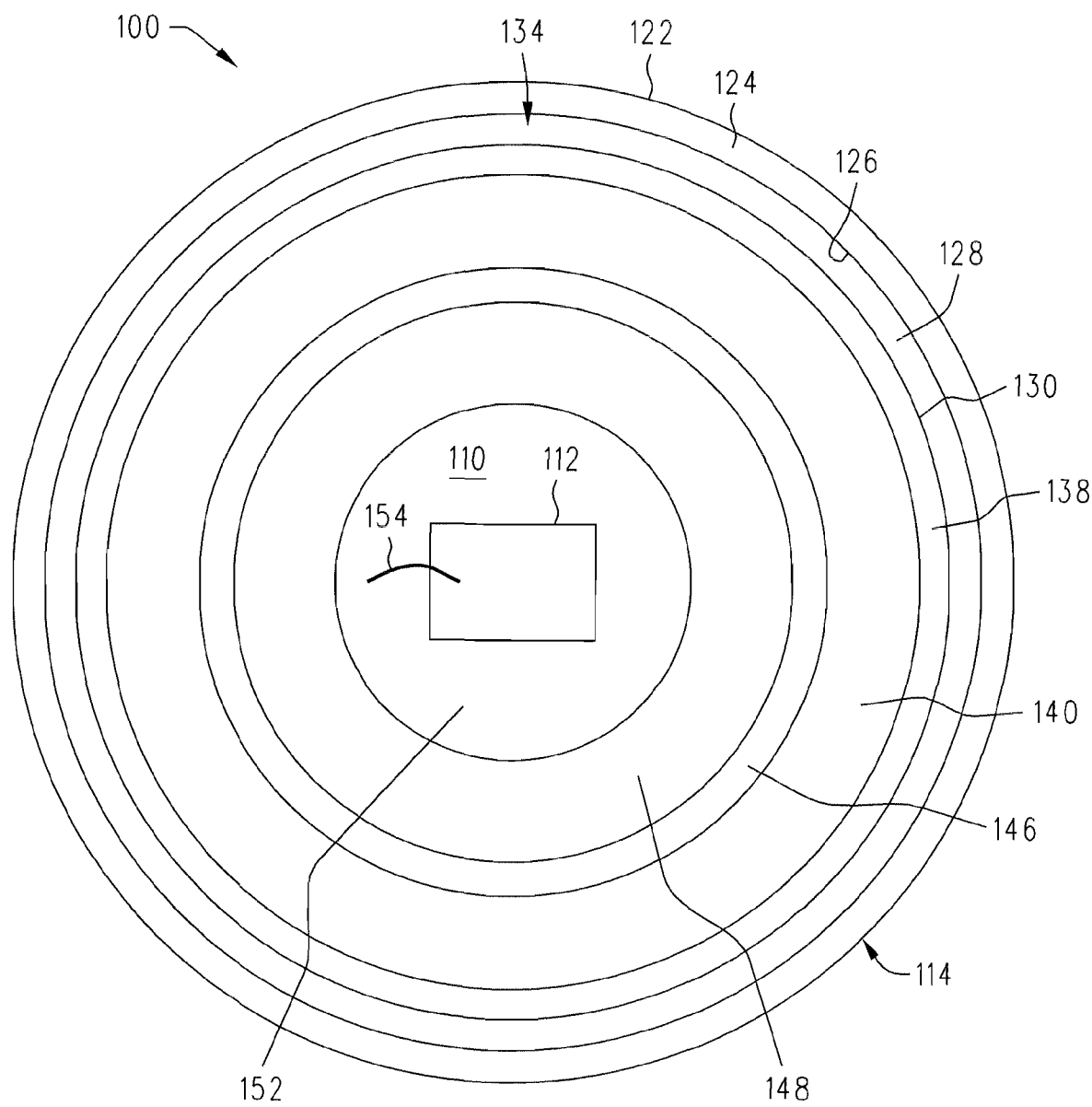
FIG. 2 is a top plan view of the light-emitting device of FIG. 1.

With additional reference to FIG. 2, which is a top plan view of the light-emitting device 100 of FIG. 1, the reflector 114 has many recessed portions and the like that secure the encapsulant. These recessed portions also reduce delamination and the probability of delamination between the reflector 114 and the encapsulant. The reflector 114 has an outer circumferal wall 122 that may form the outer wall of the light-emitting device 100. An upper edge 124 extends around the circumference of the reflector 114 and may form the highest point of the light-emitting device 100. The portion of the reflector 114 proximate the upper edge 124 is sometimes referred to as the upper portion. Light emitted from the light-emitting device exits the opening in the reflector 114 located proximate the upper portion.

Opposite the upper portion of the outer circumferal wall 122 is a first inner wall 126 that extends toward the substrate 110 from the upper edge 124. A first platform 128 extends from the first inner wall 126. A second inner wall 130 extends from the first platform 128.

The combination of the first inner wall 126, the first platform 128 and the second inner wall 130 forms a first notch 134. The first notch 134 extends axially around the reflector 114. As described in greater detail below, the first notch 134 serves to hold the encapsulant within the cavity 118. In addition, the first notch 134 limits the extent of delamination that may occur should delamination start.

A second platform 138 extends from the second inner wall 130. A slanted wall 140 extends from the second platform 138. In the embodiment of the light-emitting device described herein, the slanted wall 140 is at an angle relative to the substrate 110 so that light emitted from the light-emitting device 100 has a specified beam pattern associated therewith.

A second notch 146 is located between the slanted wall 140 and a third platform 148. The second notch 146 may extend along and around the reflector 114 as shown in FIG. 2. As with other portions of the cavity 118, the second notch 146 may be filled with the encapsulant. As described in greater detail below, the second notch 146 serves to stop delamination between the reflector 114 and the encapsulant. In the embodiment described herein, the third platform 148 is located proximate the substrate 110.

The reflector 114 has been described above as having well defined walls and platforms. In some embodiments, the transitions between the walls and platforms are relatively smooth, so there are few, if any, edges between the transitions.

In the embodiment of the light-emitting device 100 described herein, a gap 152 exists between the reflector 114 and the LED 112. The gap 152 may contain contacts used to supply power to the LED 112. For illustration purposes, a single wire bond 154 is shown extending between the gap 152 and the LED 112. The wire bond 154 may supply power or electrical signals to the LED 112. Other embodiments of the light emitting device 100 may have more wires connected between the LED 112 and the substrate 110.

Conventional light emitting devices do not have either the first notch or the second notch. Delamination between the reflector and the encapsulant may start near the top of the reflector and continue down the reflector toward the substrate. Delamination near the top of the light emitting device will adversely affect the brightness and beam pattern of the light emitting device. Delamination may also commence at the junction of the reflector and the substrate. In either situation, delamination may spread to the LED and cause the LED to separate from the substrate. In other situations, the wire bonds between the LED and the substrate may break.

The reflector 114 described herein serves to prevent delamination or stop delamination after it has started. If delamination starts proximate the top or upper edge 124 of the reflector 114, the delamination may progress down the first inner wall 126, but it will be stopped by the first notch 134. Therefore, the delamination will not be able to proceed down the slanted wall 140. The first notch 134 also serves to anchor the encapsulant to the reflector 114, which further serves to prevent delamination. The same occurs with the second notch 146.

The reflector 114 has been described herein with two notches 134 and 146, the first notch 134 and the second notch 146. Some embodiments of the reflector 114 may have only one of the notches 134 and 146. Other embodiments may have more notches located therein that serve to further anchor the encapsulant and stop delamination.

The reflector 114 described above serves to prevent delamination of the encapsulant. In addition, the LED 112 may be more firmly secured to the substrate 110 to prevent it from lifting from the substrate 110. In conventional light emitting devices, the LEDs may separate from the substrate if delamination occurs adjacent the LEDs. In addition, thermal stresses may weaken the bond between the substrate and the LED. The light-emitting device 100 described herein serves to overcome these problems by more securely fastening the LED 112 to the substrate 110.

In order to more securely attach the LED 112 to the substrate 110, the substrate 110 has at least one recessed portion for holding an adhesive located under the LED 112. In the embodiment described herein, the substrate has two recessed portions 160 or dimples. The recessed portions 160 serve to hold the adhesive used to adhere the LED 112 to the substrate 110. This extra adhesion serves to prevent the LED 112 from becoming dislodged from the substrate 110. Therefore, if delamination spreads to the LED 112, the LED 112 has a lower probability of becoming dislodged from the substrate 110.

It is noted that other recessed portions may be included under the LED 112. For example, a single ring may be used. In another example, a single recessed portion may be provided.

It is also noted that the light-emitting device 100 may be virtually any shape. For example, rather than being substantially round as shown in FIG. 2, the light-emitting device 110 and the reflector may be shaped as a rectangle, rhombus, square, or ellipse.

What is claimed is:

1. A light emitting device comprising:
   a substrate;
   a reflector extending from said substrate, said reflector forming a cavity in conjunction with said substrate;
   a light emitter located in said cavity; and
   at least one first notch located in said reflector, said at least one first notch extending substantially axially around said reflector, said at least one first notch being formed by a first wall and a second wall wherein said first wall and said second wall extend substantially perpendicular to said substrate.

2. The light emitting device of claim 1 and further comprising an encapsulant located in said cavity, wherein said encapsulant is also located in said at least one first notch.

3. The light emitting device of claim 1, wherein said reflector has an upper portion and a lower portion, said lower portion being located proximate said substrate, said at least one first notch being located proximate said upper portion.

4. The light emitting device of claim 1, wherein said reflector has an upper portion and a lower portion, said lower portion being located proximate said substrate, said at least one first notch being located proximate said lower portion.

5. The light emitting device of claim 1, wherein said light emitter is electrically connected to said substrate.

6. The light emitting device of claim 1, wherein said reflector comprises a slanted portion that intersects a platform, wherein said platform is located proximate said substrate; and wherein said at least one notch is located at the intersection of said slanted portion and said platform.

7. The light emitting device of claim 1, wherein said substrate comprises at least one recessed portion and wherein said light emitter is located on said at least one recessed portion.

8. The light emitting device of claim 7 and further comprising an adhesive located in said at least one recessed portion, said adhesive serving to bond said light emitter to said substrate.

9. The light emitting device of claim 1, wherein said reflector comprises:
   a first wall extending substantially perpendicular to said substrate;
   a first platform extending from said first wall;
   a second wall extending from said first platform and facing said first wall, the space between said first wall and said second wall constituting one of said at least one notch;
   a second platform extending from said second wall toward the center of said light emitting device;
   a slanted portion extending from said second platform toward said substrate; and
   a third platform located on said substrate and intersecting said slanted portion;
   wherein a second of said at least one notch is located at the intersection of said third platform and said slanted portion.

10. A light emitting device comprising: a substrate; a reflector extending from said substrate, said reflector forming a cavity in conjunction with said substrate; a light emitter located in said cavity; at least one first notch located in said reflector, said at least one first notch extending substantially axially around said reflector said at least one first notch being formed by a first wall and a second wall wherein said first wall and said second wall are substantially parallel to each other wherein said first wall and said second wall extend substantially perpendicular to said substrate; and at least one second recessed portion located in said substrate proximate said light emitter.

11. The light emitting device of claim 10 and further comprising an adhesive located in said at least one recessed portion, said adhesive serving to bond said light emitter to said substrate.

12. The light emitting device of claim 10 and further comprising an encapsulant located in said cavity, wherein said encapsulant is also located in said at least one first notch.

13. The light emitting device of claim 10, wherein said reflector has an upper portion and a lower portion, said lower portion being located proximate said substrate, said at least one first notch being located proximate said upper portion.

14. The light emitting device of claim 10, wherein said reflector has an upper portion and a lower portion, said lower portion being located proximate said substrate, said at least one first notch being located proximate said lower portion.

15. A light emitting device comprising:
   a substrate;
   a reflector extending from said substrate, said reflector forming a cavity in conjunction with said substrate, said reflector comprising:
   a first wall extending substantially perpendicular to said substrate;
   a first platform extending from said first wall;
   a second wall extending from said first platform and facing said first wall, the space between said first wall and said second wall constituting a first notch;

a second platform extending from said second wall toward the center of said light emitting device;

a slanted portion extending from said second platform toward said substrate; and a third platform located on said substrate and intersecting said slanted portion;

wherein a second notch is located at the intersection of said third platform and said slanted portion;

a light emitter located in said cavity; and at least one recessed portion located in said substrate proximate said light emitter.

16. The light emitting device of claim 15 and further comprising an adhesive located in said at least one recessed portion, said adhesive serving to bond said light emitter to said substrate.

17. The light emitting device of claim 15 and further comprising an encapsulant located in said cavity.

* * * * *